United States Patent
Chen et al.

(10) Patent No.: US 7,336,543 B2
(45) Date of Patent: Feb. 26, 2008

(54) NON-VOLATILE MEMORY DEVICE WITH PAGE BUFFER HAVING DUAL REGISTERS AND METHODS USING THE SAME

(75) Inventors: Chung Zen Chen, Hsinchu (TW); Jo Yu Wang, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 32 days.

(21) Appl. No.: 11/358,767

(22) Filed: Feb. 21, 2006

(65) Prior Publication Data
US 2007/0195635 A1    Aug. 23, 2007

(51) Int. Cl.
G11C 7/10 (2006.01)
G11C 16/04 (2006.01)

(52) U.S. Cl. .......................... 365/189.05; 365/189.01; 365/185.11

(58) Field of Classification Search ............ 365/189.05
See application file for complete search history.

(56) References Cited

U.S. PATENT DOCUMENTS

| | | | | |
|---|---|---|---|---|
| 6,671,204 B2 | | 12/2003 | Im | |
| 6,717,857 B2* | | 4/2004 | Byeon et al. .......... | 365/185.21 |
| 6,963,509 B1* | | 11/2005 | Ju .......................... | 365/189.05 |
| 6,996,014 B2* | | 2/2006 | Lee et al. ............... | 365/189.05 |
| 7,016,229 B2* | | 3/2006 | Kim ....................... | 365/185.17 |
| 7,046,554 B2* | | 5/2006 | Lee ........................ | 365/185.18 |
| 7,149,130 B2* | | 12/2006 | Lee ........................ | 365/189.05 |
| 7,184,310 B2* | | 2/2007 | Vorraro et al. ......... | 365/185.17 |
| 7,193,911 B2* | | 3/2007 | Kim .......................... | 365/194 |
| 7,200,044 B2* | | 4/2007 | Won et al. ............. | 365/185.22 |
| 2006/0007774 A1* | | 1/2006 | Zanardi et al. ............. | 365/235 |
| 2006/0181924 A1* | | 8/2006 | Cha ....................... | 365/185.12 |
| 2006/0187710 A1* | | 8/2006 | Son ....................... | 365/185.09 |

* cited by examiner

Primary Examiner—Son L. Mai
(74) Attorney, Agent, or Firm—Egbert Law Offices

(57) ABSTRACT

A non-volatile memory device with a page buffer having dual registers includes a memory cell array, a selector circuit and a page buffer circuit, the selector circuit being coupled to an exterior data line, the page buffer circuit including a first register and a second register being coupled between the memory cell array and the selector circuit, and the first register and second register being commonly coupled through a sense node. The first and second registers alternately write data to the memory cell array for programming. As one of the first and second registers performs programming, the other register stores data from the data line concurrently. In other words, the second register stores data from the data line when the first register is in programming, whereas the first register stores data from the data line when the second register is in programming.

24 Claims, 18 Drawing Sheets

NON-VOLATILE MEMORY DEVICE WITH PAGE BUFFER HAVING DUAL REGISTERS AND METHODS USING THE SAME

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention is related to a semiconductor memory device and, more specifically, to a non-volatile memory device with a page buffer circuit having dual registers and the methods using the same.

BACKGROUND OF THE INVENTION

U.S. Pat. No. 6,671,204, titled "non-volatile memory device with page buffer having dual registers and methods of using the same", describes a page buffer design with cache program and copy-back functions. FIG. 1 illustrates the schematic diagram of Page Register and Sense Amplifier (S/A) block 120. The Page Register and S/A block 120 is coupled between a memory cell array 110 and a Y-gating circuit 130. The Page Register and Sense Amplifier (S/A) block 120 includes a bit line control circuit 140 and a page buffer 122. The page buffer 122 has a sense line 125 that connected to the bit line control circuit 140 through a sense node E.

The bit line control circuit 140 includes four NMOS transistors 141, 142, 143 and 144. The NMOS transistors 141 and 142 are serially coupled between bit lines BLE and BLO, and are controlled by control signals VBLE and VBLO, respectively. The drains of transistors 141 and 142 are commonly coupled to a signal line VIRPWR. The NMOS transistor 143 is coupled between the bit line BLE and the sense node E, and is controlled by a control signal BLSHFE. The NMOS transistor 144 is coupled between the bit line BLO and the sense node E, and is controlled by a control signal BLSHFO.

The page buffer 122 has a main register 150 and an auxiliary register 170; both are connected to the sense line 125. The main register 150 includes two NMOS transistors 151 and 152, two inverters 153 and 154, and a PMOS transistor 155. The data is stored in a main latch 156, formed by inverters 153 and 154. The PMOS transistor 155 serves as a pre-charge circuit for the main latch 156. The auxiliary register 170 includes two NMOS transistors 171 and 172, two inverters 173 and 174, and a PMOS transistor 175. The inverters 173 and 174 form an auxiliary latch 176. The PMOS transistor 175 serves as a pre-charge circuit for the auxiliary latch 176. An NMOS transistor 181 controlled by a control signal PDUMP serves as a switch for data transmission between the auxiliary register 170 and the main register 150 through the sense line 125. NMOS transistors 182 and 183 are provided for controlling data storage from a data line 131 to the auxiliary register 170, and are performed responsive to external control signals DI and nDI, respectively. A PMOS transistor 148 provides current to the bit lines BLE and BLO through the sense line 125 during reading. The PMOS transistor 148 is connected between a power voltage and the sense line 125, and is controlled by a control signal PLOAD.

An NMOS transistor 184 is turned on to connect the main register 150 and a selected bit line BLE or BLO when data to be programmed is transferred to the selected bit line BLE or BLO from the main register 150. An NMOS transistor 185, controlled by a control signal PBDO, outputs read-out data from the selected bit line to the exterior of the page buffer 122. A transistor 186 is provided for checking the program state, and provides program pass or fail information at a node B of the main register 150.

The Y-gating circuit 130 is between the page buffer circuit 120 and the data line 131. The Y-gating circuit 130 is constituted of two NMOS transistors 132 and 133 that are controlled by signals YA and YB, respectively.

During a cache program operation, the external input data is stored in the auxiliary register 170 first, and then is transmitted to the main register 150 through the sense line 125 for programming and verification. During a copy-back function, the data in a memory cell array 110 is read out and stored to the auxiliary register 170 first. After new data is inputted to the auxiliary register 170, the whole page data is transferred to the main register 150 for programming and verification. Because the data have to be transferred between the main register 150 and the auxiliary register 170, its programming procedure is relatively complicated. Moreover, it spends more time during the data transfer process.

BRIEF SUMMARY OF THE INVENTION

The objective of the present invention is to provide a non-volatile memory device with a page buffer circuit having dual registers, by which data transfer between the two registers when programming can be omitted, so that the programming efficiency can be significantly enhanced. Moreover, for copy-back program function, only one register is active so that the operation can be simplified.

In order to achieve the above objective, a non-volatile memory device, e.g., a flash memory, with a page buffer having dual registers is disclosed. The non-volatile memory device comprises a memory cell array, a selector circuit and a page buffer circuit, the selector circuit being coupled to an exterior data line for page buffer selection, the page buffer circuit including a first register and a second register being coupled between the memory cell array and the selector circuit, and the first register and the second register being commonly coupled through a sense node and a data node in parallel. The first and second registers alternately write data to the memory cell array for programming. As one of the first and second registers performs programming, the other register stores data from the data line concurrently. In other words, the second register stores data from the data line when the first register is in programming, whereas the first register stores data from the data line when the second register is in programming.

The memory cell array includes at least two cell strings, and the two cell strings are coupled to the page buffer circuit through two bit lines. In the first embodiment, the cell string comprises a first end electrically connected to the page buffer circuit through a bit line, and a second end electrically connected to a common source line with a ground voltage.

The two bit lines are associated with transistors as a bit line control circuit in an attempt to select one of the bit lines and connect the selected bit line and the sense node. Moreover, the bit line control circuit provides the bit lines with appropriate bias voltages for accessing the memory cells in the memory cell array.

Each of the first and second register comprises a latch for holding data, a first read control circuit for latching bit line data to the latch during a read or program verification or copy-back program verification operation, a first program control circuit for transferring data on the data line to the latch during a program operation, a second program control circuit for controlling data transmission from the latch to the sense node, and a first pre-set control circuit for setting the latch to a predetermined value during a program or copy-back operation.

For a flash memory, there are four operations: program, read, copy-back and erase verification. The later three operations all involve with flash cell sensing, while the first program operation involves with flash cell driving from the registers. The first and second registers perform a program operation alternately, but only the first register is active during a read, copy-back or erase verification operation. Thus, the first register further comprises a second read control circuit for latching bit line data to the latch during a copy-back read or erase verification operation, a fourth read control circuit for transferring data in the latch to the data line during a read operation, and a second pre-set control circuit for setting the latch to a predetermined value during a read operation.

The bit line is pre-charged to a power voltage Vcc for the non-programming cell and the bit line is pulled down to Vss, e.g., a ground voltage, for the programming cell during a program operation. During reading, the bit line is discharged to Vss first and then pre-charged to a voltage level. The ground voltage on the common source line will pull the bit line to a ground voltage level if the accessed cell is in an erased state, whereas the bit line voltage is at a voltage level if the accessed cell is in a programmed state. Therefore, the state of the accessed cell can be distinguished.

Moreover, a non-volatile memory cell can be operated in a reverse direction; namely the side of the cell string connected to a bit line is treated as a source node, and the other side of the cell string is treated as a drain side. The drain side is electrically connected to a common drain line coupled to a power voltage.

Likewise, during programming, the bit line is biased to Vss for programming an accessed memory cell and biased to Vcc to inhibit the programming. The programming mechanism can be F-N tunneling or source side injection. However, during reading, the bit line is discharged to a ground voltage and the subsequent bit line pre-charge process is omitted. Then, the power voltage on the common drain line will pull the bit line to a power voltage level if the accessed cell is in an erased state due to the turn on of the accessed cell. In contrast, the bit line voltage will remain Vss level if the accessed cell is in a programmed state.

To achieve the above functionalities, the page buffer circuit for this type needs to be modified. An NMOS transistor having a source connected to ground for bit line discharge during reading is added to the bit line control circuit. An inverter controlled by the sense node is added to cause an inverse logic state in the sense node. Because there is no inverse read of the copy-back operation for this type, the second read control circuit is connected to the other side of the latch in comparison with that of the first embodiment.

As mentioned above, the first and second registers of the page buffer circuit alternately perform programming. In addition, the first register performs programming and the second register stores data to be programmed at the same time for a cache program operation. As a result, the data transfer between two registers of the page buffer can be omitted, and the relevant control signals can be simplified. Moreover, a pre-charge process is not needed during a read operation for the memory cell array operated in a reverse direction, so memory access time and power consumption can be reduced.

BRIEF DESCRIPTION OF THE SEVERAL VIEWS OF THE DRAWINGS

FIG. 2($b$) illustrates a schematic view of a diagram of the memory cell array shown in FIG. 2($a$).

FIG. 2($c$) illustrates a schematic view of a diagram of the page buffer circuit shown in FIG. 2($a$).

FIG. 9($b$) illustrates a schematic view of a diagram of a page buffer circuit according to the second embodiment of the present invention.

DETAILED DESCRIPTION OF THE INVENTION

Figure 1:
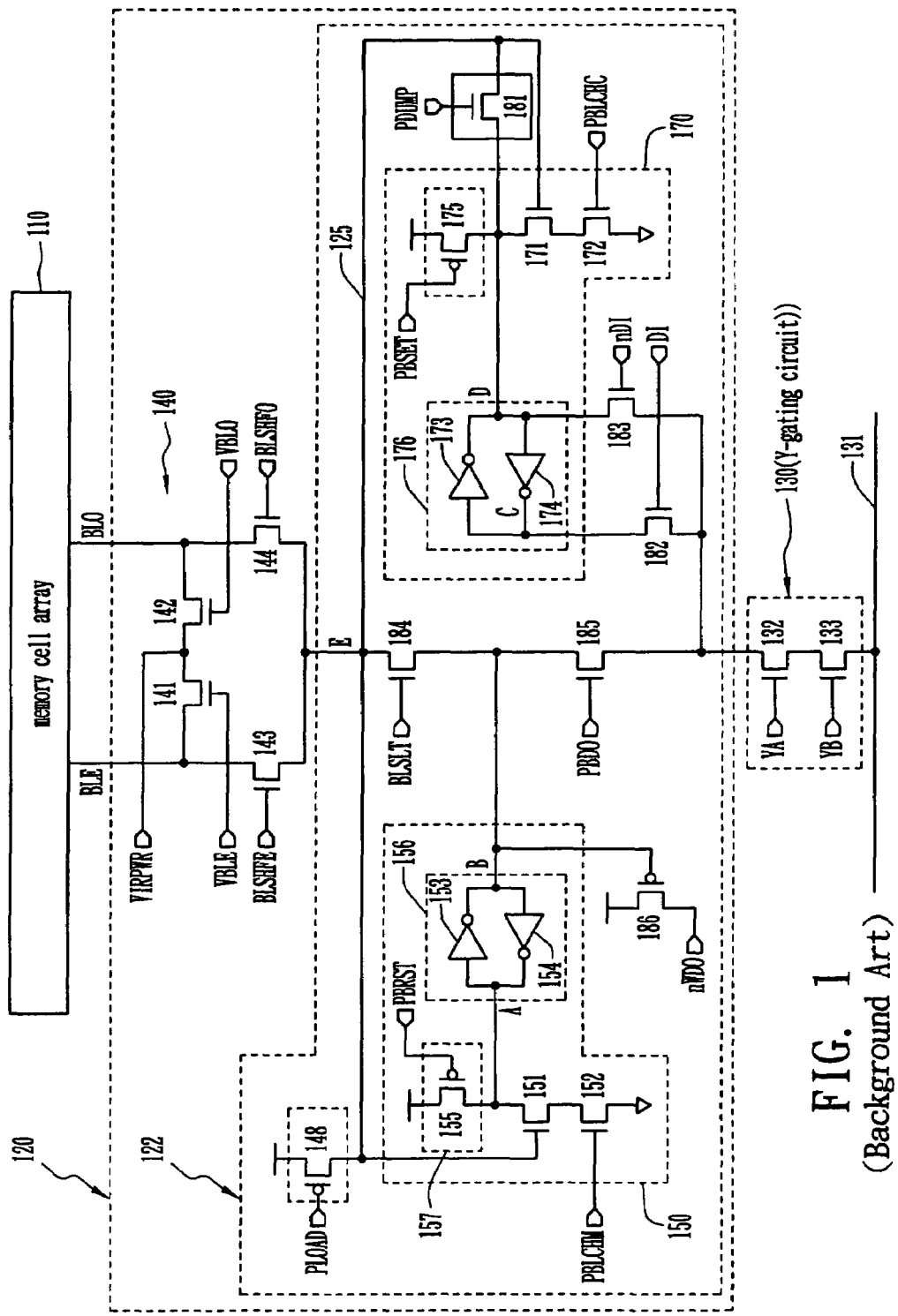
FIG. 1 illustrates a schematic view of a diagram of a known page buffer circuit.
Figure 2A:
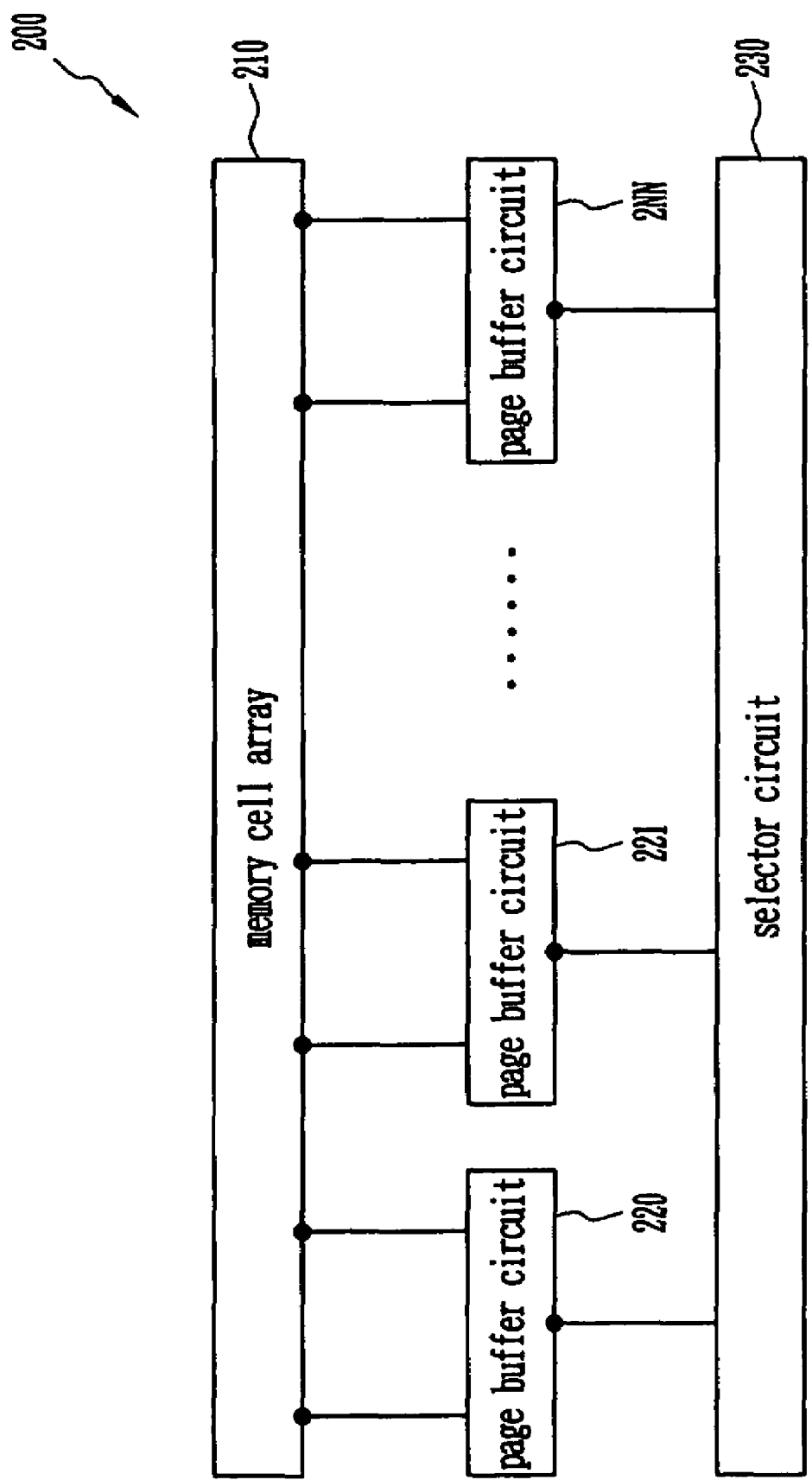
FIG. 2($a$) illustrates a schematic view of a block function diagram of a flash memory device according to the first embodiment of the present invention.

FIG. 2($a$) illustrates a flash memory device 200 including a memory cell array 210, a plurality of page buffer circuits 220, 221, . . . and 2NN, and a selector circuit 230. The page buffer circuits 220, 221, and 2NN are coupled between the memory cell array 210 and the selector circuit 230.

Figure 2B:
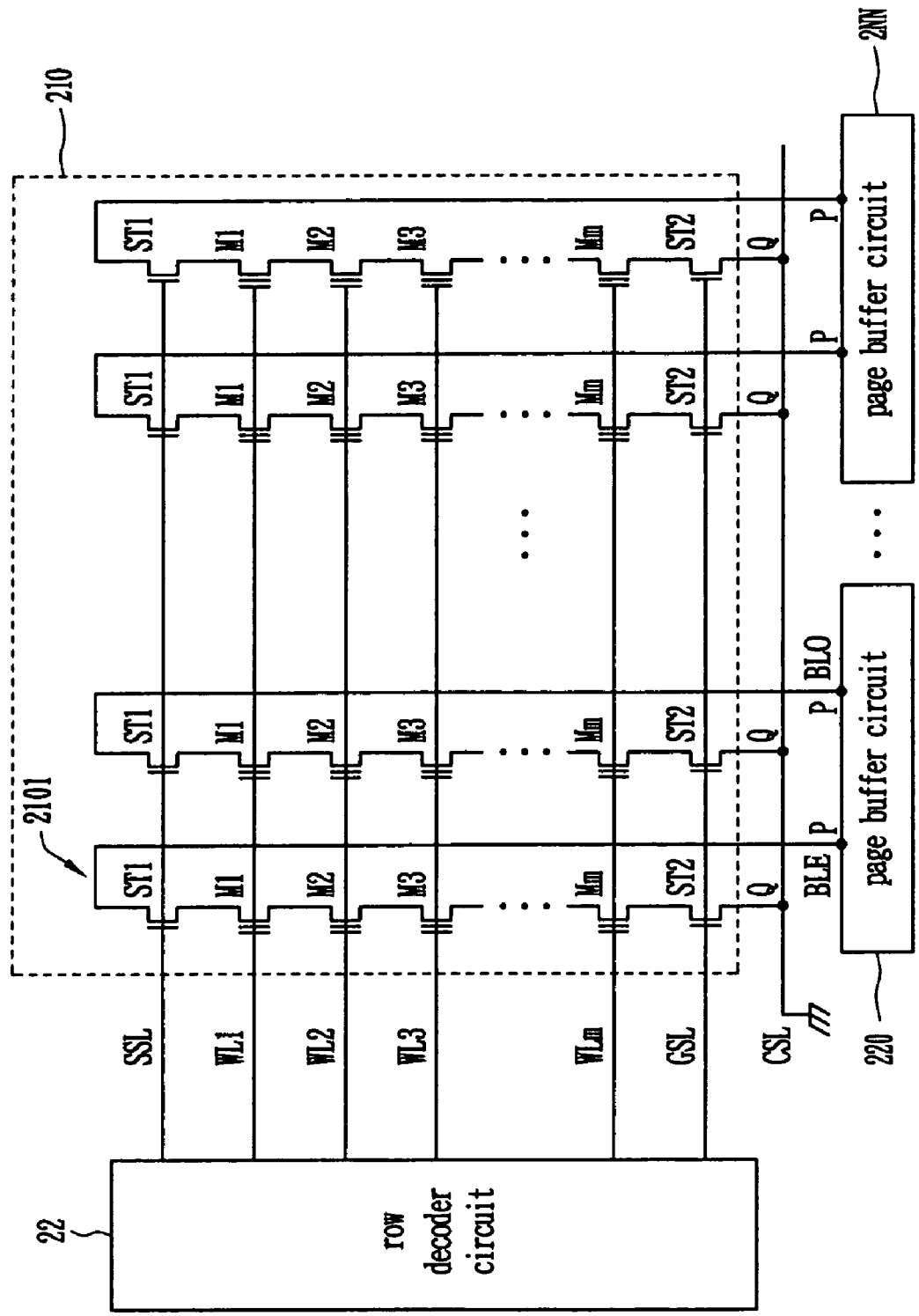

FIG. 2(b) illustrates the schematic diagram of the memory cell array 210 The memory cell array 210 comprises a plurality of cell strings 2101. Each cell string 2101 comprises a first end P electrically connected to a corresponding page buffer circuit 220, 221, . . . , or 2NN through a bit line BLE or BLO, and a second end Q electrically connected to a common source line CSL. The cell string 2101 includes a string selection transistor ST1 coupled to the bit line BLE, a ground selection transistor ST2 coupled to a common source line CSL and memory cells M1-Mm serially coupled between the string selection transistor ST1 and the ground selection transistor ST2. The bit line BLE is connected to the drain node of the memory cell M1 through the transistor ST1, whereas the common source line CSL is connected to the source node of the memory cell Mm through the transistor ST2. The string selection transistor ST1, the memory cells M1-Mm and the ground selection transistor ST2 are coupled to a string selection line SSL, word lines WL1-WLm and a ground selection line GSL, respectively. The lines SSL, WL1-WLm and GSL are electrically connected to a row decoder circuit 22. The common source line CSL is connected to a ground voltage. The two adjacent bit lines BLE and BLO form a bit line pair connected to the page buffer circuit 220, and other bit line pairs are connected to the page buffer circuits 221, 222, . . . and 2NN, respectively.

Figure 2C:
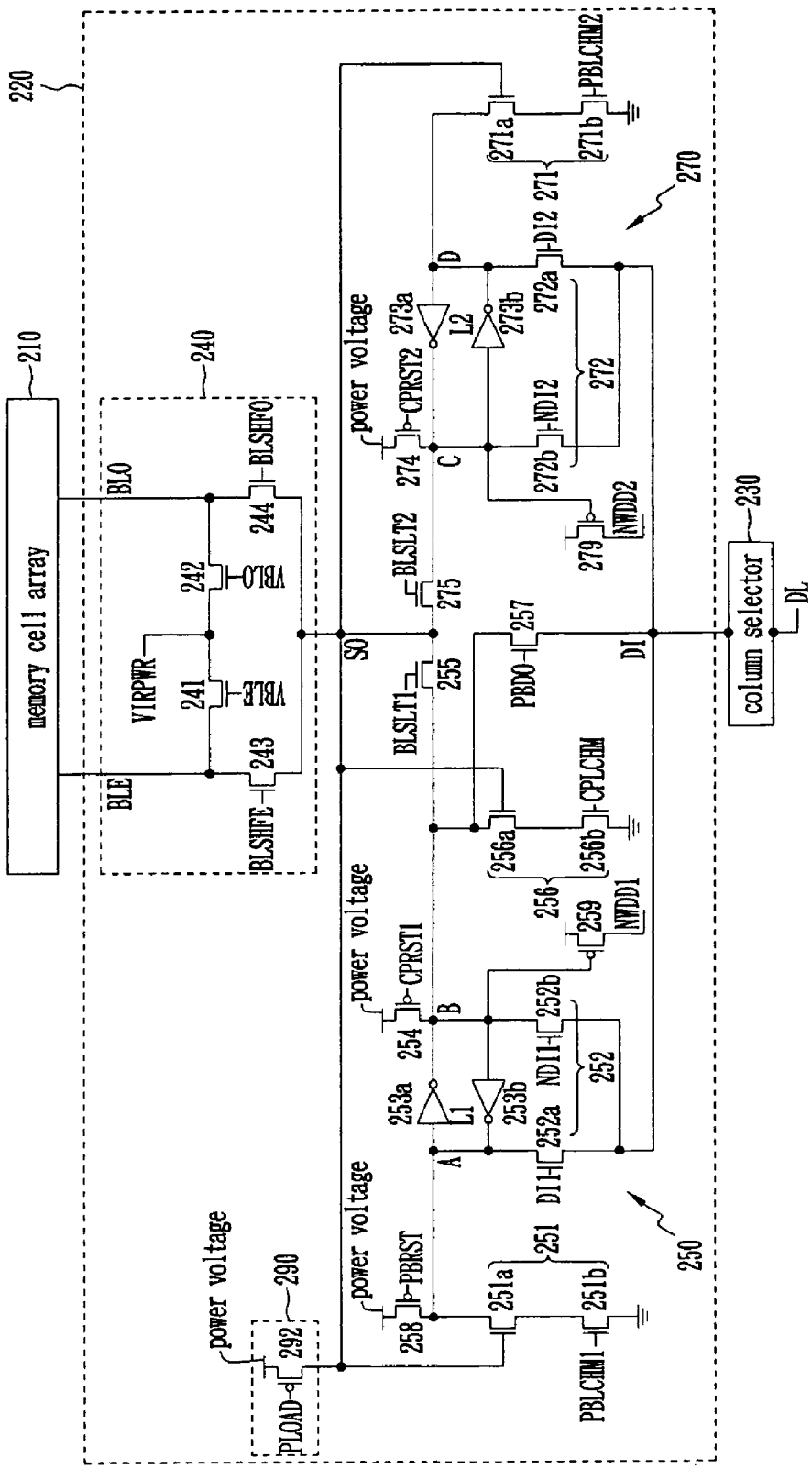

FIG. 2(c) illustrates a schematic diagram of the page buffer circuit 220. The page buffer circuit 220 includes a bit line control circuit 240, a pre-charge circuit 290, a first register 250 and a second register 270.

The bit line control circuit 240 includes four NMOS transistors 241, 242, 243 and 244. The NMOS transistors 241 and 242 are serially coupled between bit lines BLE and BLO, and are controlled by their corresponding control signals VBLE and VBLO. The drains of transistors 241 and 242 are commonly coupled to a signal line VIRPWR. The NMOS transistor 243 is coupled between the bit line BLE and a sense node SO, and is controlled by a control signal BLSHFE. The NMOS transistor 244 is coupled between bit line BLO and the sense node SO, and is controlled by a control signal BLSHFO.

The pre-charge circuit 290 includes a PMOS transistor 292, which is coupled between a power voltage and the sense node SO, and is controlled by a control signal PLOAD. The PMOS transistor 292 provides current to the bit lines BLE and BLO through the sense node SO.

The first register 250 includes a latch L1 consisting of inverters 253a and 253b, a first read control circuit 251 consisting of NMOS transistors 251a and 251 b, a second read control circuit 256 consisting of NMOS transistors 256a and 256b, a fourth read control circuit consisting of an NMOS transistor 257, a first program control circuit 252 consisting of NMOS transistors 252a and 252b, a second program control circuit consisting of an NMOS transistor 255, a first pre-set control circuit consisting of an PMOS transistor 254, and a second pre-set control circuit consisting of an PMOS transistor 258.

The NMOS transistor 255 is coupled between a second latch node B and the sense node SO, and is controlled by a control signal BLSLT1. The NMOS transistor 252a is coupled between a first latch node A of the latch L1 and a data node DI1, and is controlled by a control signal DI1; whereas the NMOS transistor 252b is coupled between the second latch node B of the latch L1 and the data node DI, and is controlled by a control signal NDI1. The NMOS transistors 251a and 251b are coupled serially, and controlled by the sense node SO and a control signal PBLCHM1, respectively. The NMOS transistors 256a and 256b are coupled serially, and controlled by the sense node SO and a control signal CPLCHM, respectively. The PMOS transistor 254 is coupled between a power voltage and the second latch node B, and is controlled by a control signal CPRST1. The PMOS transistor 258 is coupled between a power voltage and the first latch node A, and is controlled by a control signal PBRST. The NMOS transistor 257 is coupled between the second latch node B and the data node DI, and is controlled by a control signal PBDO.

The second register 270 includes a latch L2 consisting of inverters 273a and 273b, a third read control circuit 271 consisting of NMOS transistors 271a and 271b, a third program control circuit 272 consisting of NMOS transistors 272a and 272b, a fourth program control circuit consisting of an NMOS transistor 275, and a third pre-set control circuit consisting of an PMOS transistor 274.

The NMOS transistor 275 is coupled between a third latch node C and the sense node SO, and is controlled by a control signal BLSLT2. The NMOS transistor 272a is coupled between a fourth latch node D and data node DI, and is controlled by a control signal DI2; whereas the NMOS transistor 272b is coupled between the third latch node C and the data node DI, and is controlled by a control signal NDI2. The NMOS transistors 271a and 271b are coupled serially, and controlled by the sense node SO and a control signal PBLCHM2, respectively. The PMOS transistor 274 is coupled between a power voltage and the sense node SO, and is controlled by a control signal CPRST2.

Figure 3:
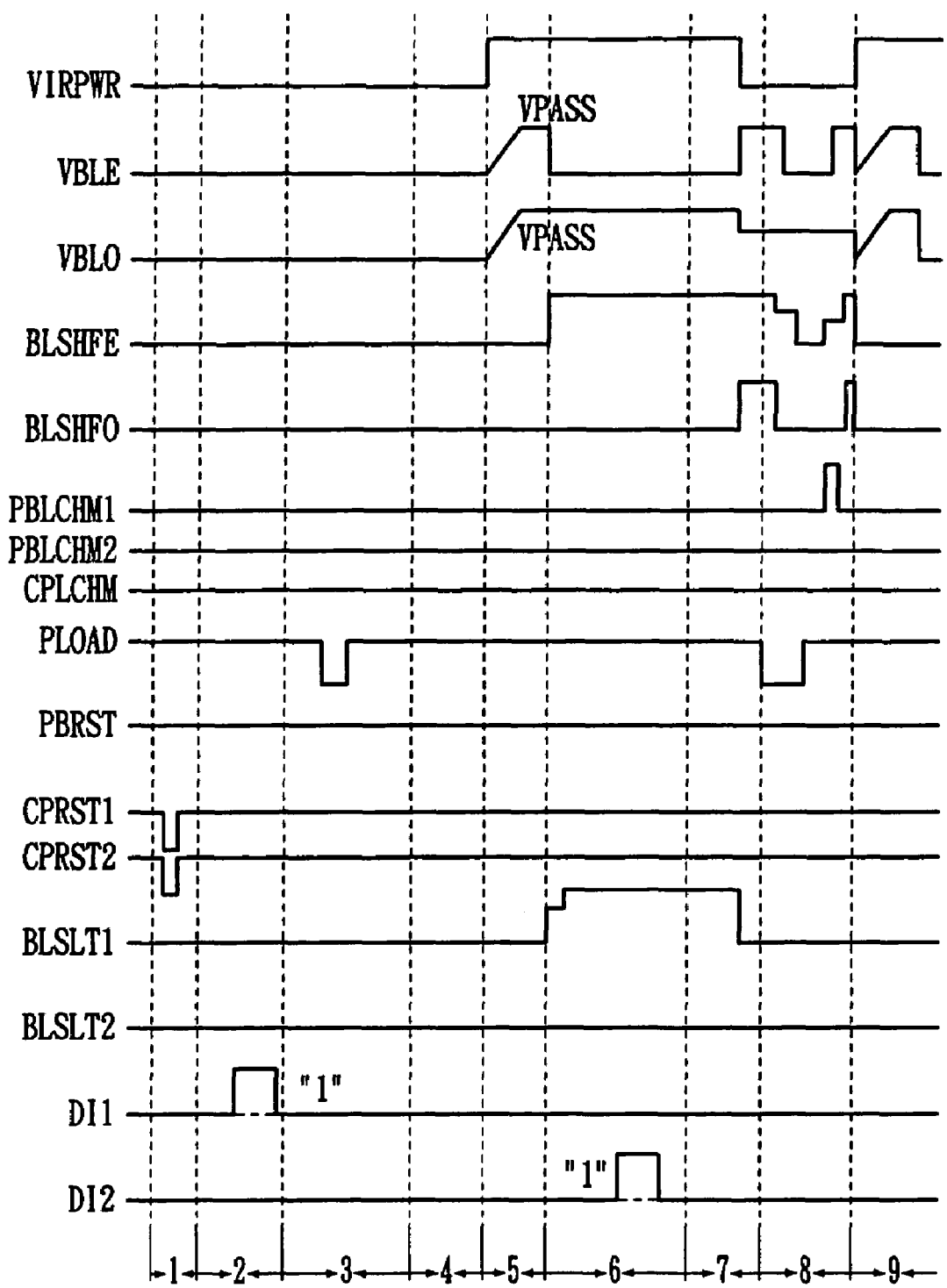
FIG. 3 illustrates a timing diagram for programming according to the first embodiment of the present invention.
Figure 4:
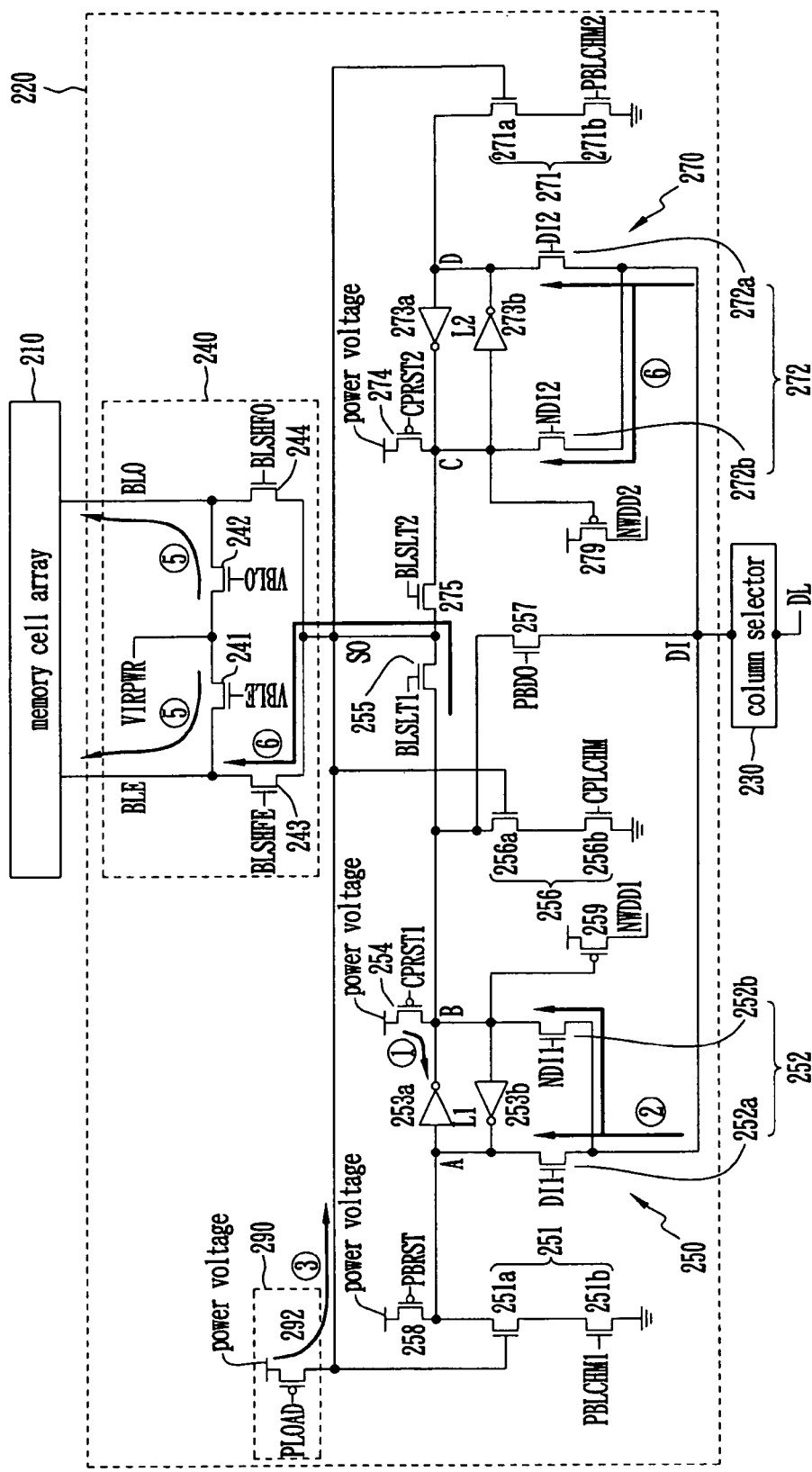
FIG. 4 illustrates a schematic view of data flows for programming according to the first embodiment of the present invention.

Referring to FIG. 3 and FIG. 4, a cache program method of the first embodiment of the present invention is described. FIG. 3 shows command signals that are applied to the circuit of FIG. 2(c). The abscissa is divided into 9 segments, respectively labeled 1-9. FIG. 4 shows how data is transferred in the circuit of FIG. 2(c), which should be referred to along with FIG. 3 in the light of the labels.

At first (time segment 1), in order to pre-set latches L1 and L2 to a predetermined value, the PMOS transistors 254 and 274 are turned on by activating the control signals CPRST1 and CPRST2 logic low during a selected interval.

In time segment 2, the latch node B of the first register 250 is at a logic high state. The first set of data to be programmed is stored in the first latch L1. Data "1" or "0" in data line DL is thus stored to the latch L1 by activating the control signal DI1 or NDI1 logic high, respectively. In other words, the DI1 and NDI1 are in inverse states.

In time segment 3, the sense node SO is pre-charged by activating the control signal PLOAD logic low during a selected short interval. In time segment 4, there are no transitions on all the signals.

In time segment 5, the bit lines BLE and BLO are pre-charged by pulling the signal VIRPWR logic high, and activating the control signals VBLE and VBLO logic high. This prevents non-selected cells from incorrect operation. If the BLE is a selected bit line, the signal VBLE is logic high in time segment 5 and switches to logic low in subsequent time segment 6, whereas the signal VBLO remains logic high in subsequent time segment 6.

In time segments 6 and 7, two actions occur concurrently. The data to be programmed is transferred from the first register 250 to the selected bit line BLE by activating signals BLSLT1 and BLSHFE logic high, and then the data is transferred from the selected bit line BLE to the memory cell array 110. At the same time, the second set of data to be programmed is stored in the second register 270 from the data line DL. Data "1" or "0" in the data line DL is stored (or loaded) in the second latch L2 by activating the control signal DI1 or NDI2 logic high, respectively. Because the first register performs data programming and the second register loads data concurrently, i.e., a cache operation, load and program time can be tremendously reduced.

In time segment 8, the verification for programming starts. The read operation of the verification will be described in more detail later.

In time segment 9, the bit lines VBLE and VBLO are pre-charged again for the next load/program operation.

Likewise, in the next cache program operation, the data to be programmed is transferred from the second register 270 to a selected bit line BLE or BLO by activating BLSLT2 signal and the similar operations of the bit line control circuit 240, and at the same time the third set of data to be programmed is stored in the first register 250 from the data line DL.

In other words, when data from one register is being programmed, the next data to be programmed is loaded into the other register, and vice versa. Moreover, the data is programmed from the register to a memory cell string directly, so that the intermediate process of data transmission from one register to the other one, as mentioned in the prior skill, is unnecessary.

A normal read operation of the page buffer circuit 220 is described with reference to FIG. 5 and FIG. 6, where data is read out from the memory cell array 210, and the gate control signals of memory cells to be read are applied by appropriate voltages through word lines.

Figure 5:
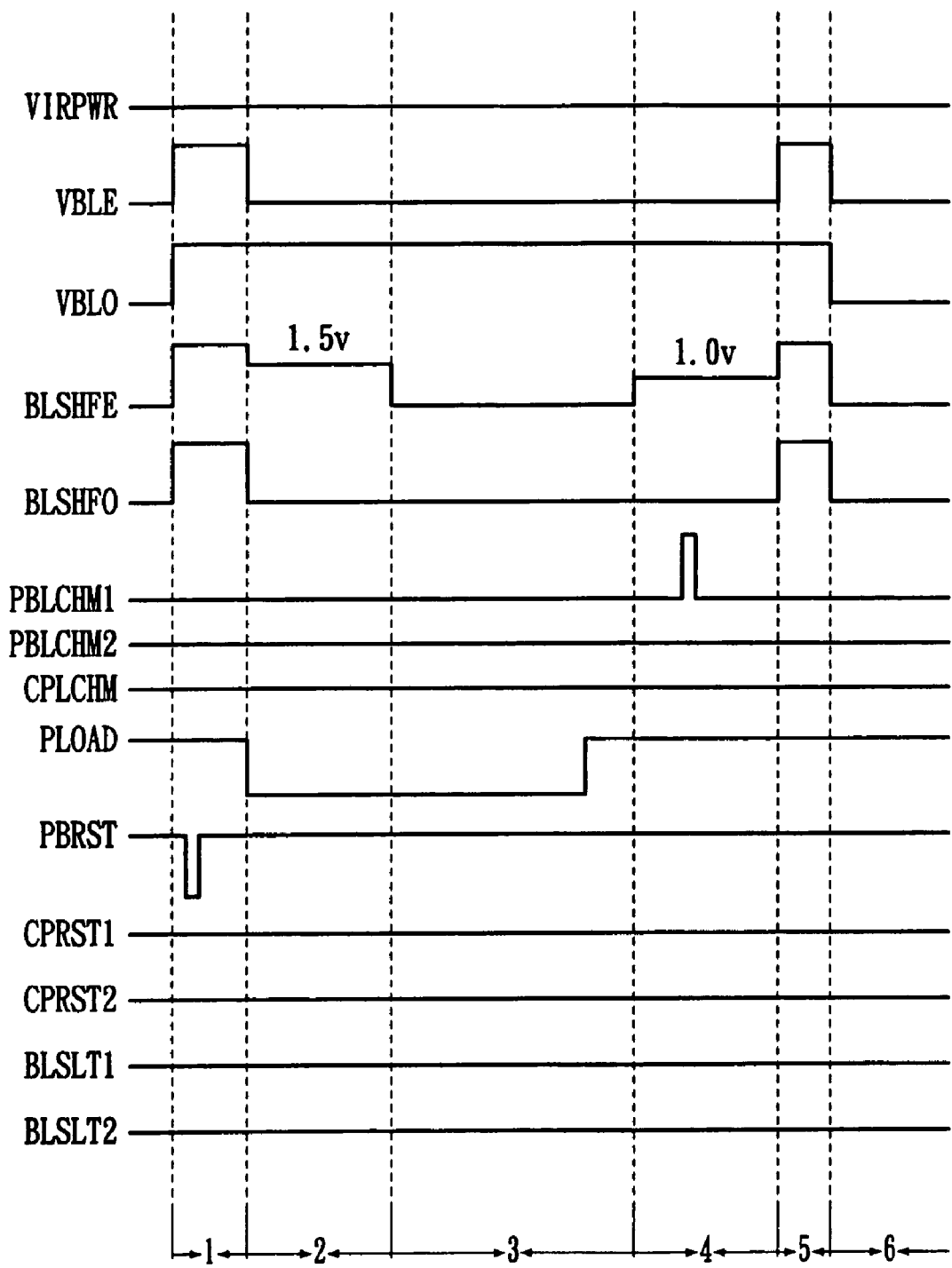
FIG. 5 illustrates a timing diagram for reading according to the first embodiment of the present invention.
Figure 6:
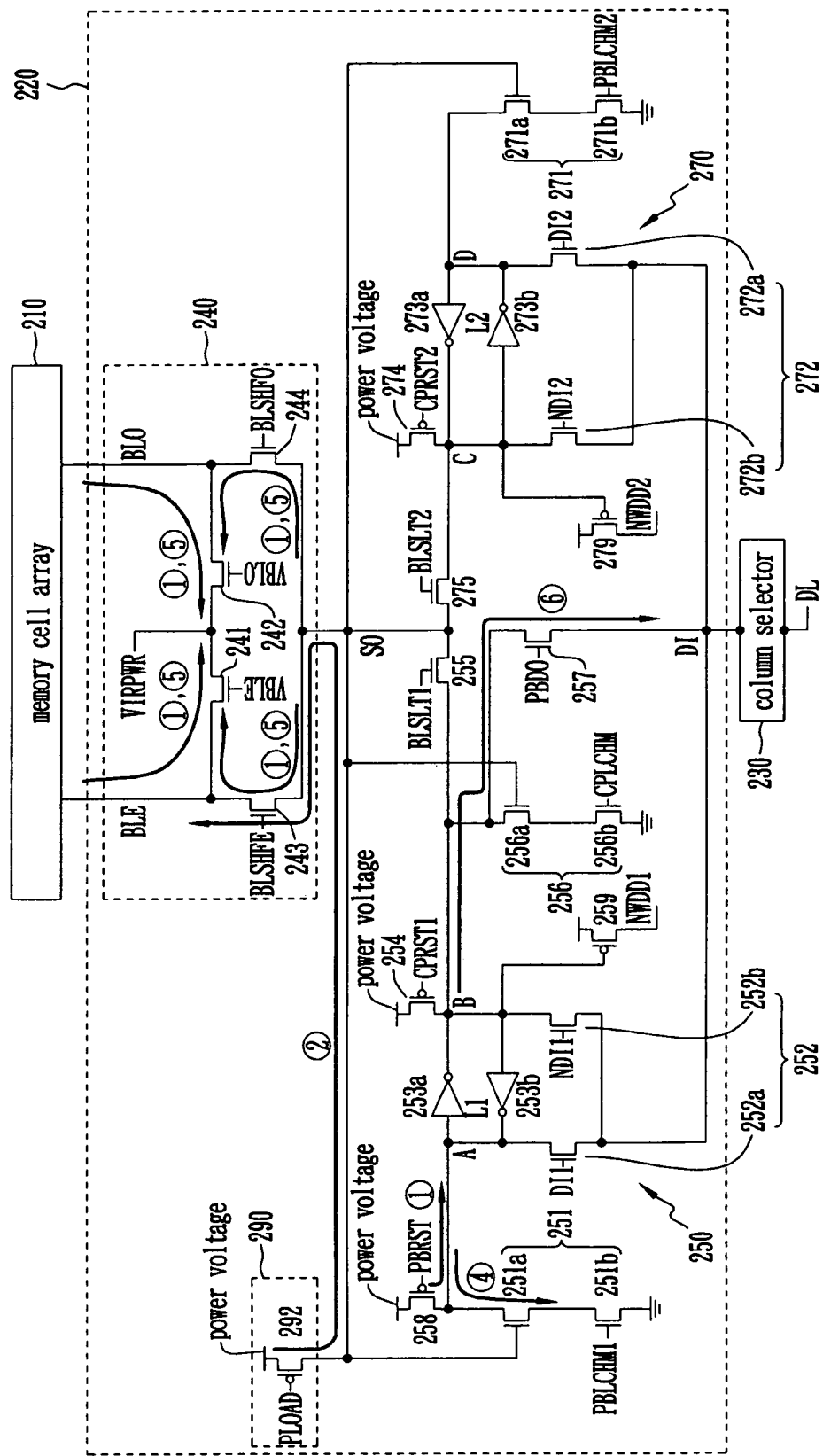
FIG. 6 illustrates a schematic view of data flows for reading according to the first embodiment of the present invention.

FIG. 5 shows command signals that are applied to the circuit of FIG. 2(*c*). The abscissa is divided into 6 segments, respectively labeled 1-6. FIG. 6 shows how data is transferred in the circuit of FIG. 2(*c*), which should be referred to along with FIG. 5 in the light of the labels.

In time segment 1, the bit lines BLE and BLO are first discharged through NMOS transistors 241 and 242 by zeroing the signal VIRPWR and activating the control signals VBLE and VBLO logic high. At the same time, a PBRST signal switches from a logic high state to a logic low state during a selected interval to turn on the transistor 258, so that the latch node A of the first register 250 goes to a logic high state, i.e., setting the latch L1 to a predetermined value.

In time segment 2, the PLOAD signal goes to logic low so as to turn on the PMOS transistor 292. An approximately voltage, e.g., 1.5V, is applied to the control signal BLSHFE of the NMOS transistor 243, so as to pre-charges the bit line BLE to a pre-charged voltage. Accordingly, the voltage of the sense node SO will be equivalent to the pre-charged voltage.

In time segment 3, the signal BLSHFE goes to a logic low state of the ground voltage and subsequently the signal PLOAD switches to be logic high, i.e., the transistors 243 and 292 are turned off.

The pre-charged voltage of the bit line varies according to the state of a selected memory cell. In the case where the selected memory cell is in a programmed state, the pre-charged voltage of the bit line remains. In the case where the selected memory cell is in an erased cell, the pre-charged voltage of the bit line is pulled to a ground voltage gradually. Therefore, the voltage of the sense node SO depends upon the programmed or erased state of the memory cell.

In time segment 4, a gate control signal PBLCHM1 of the NMOS transistor 251*b* goes to a logic high state and the signal BLSHFE is biased at 1.0V during a selected short interval, and the NMOS transistor 251*a* is turned on or off according to the state of the sense node SO. The transistor 251*a* is turned on if the selected memory cell is at a programmed state, and is turned off if the selected memory cell is at an erased state. As a result, the state of the sense node SO is stored in the latch L1. In other words, the data state of the selected memory cell is stored in the first register 250.

In time segment 5, the NMOS transistors 241, 242, 243 and 244 are turned on, i.e., the control signals VBLE, VBLO, BLSHFE and BLSHFO are in logic high state, so as to discharge the bit lines BLE and BLO and the sense node SO through the signal VIRPWR with a logic low state.

In time segment 6, the data stored in the first register 250 is transferred to the data line DL through the NMOS transistor 257 that is controlled by the control signal PBDO.

Figure 7:
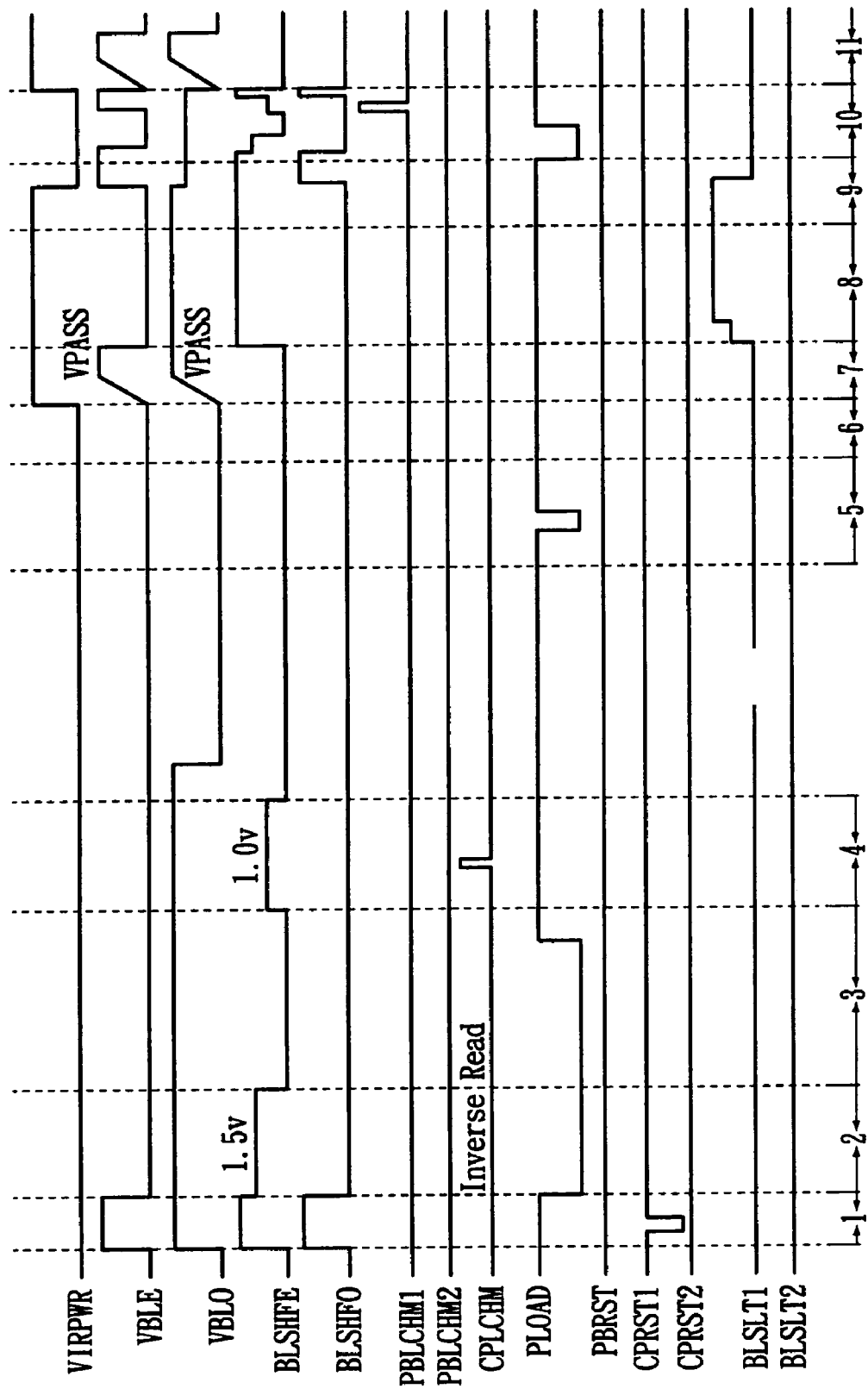
FIG. 7 illustrates a timing diagram for a copy-back operation according to the first embodiment of the present invention.
Figure 8:
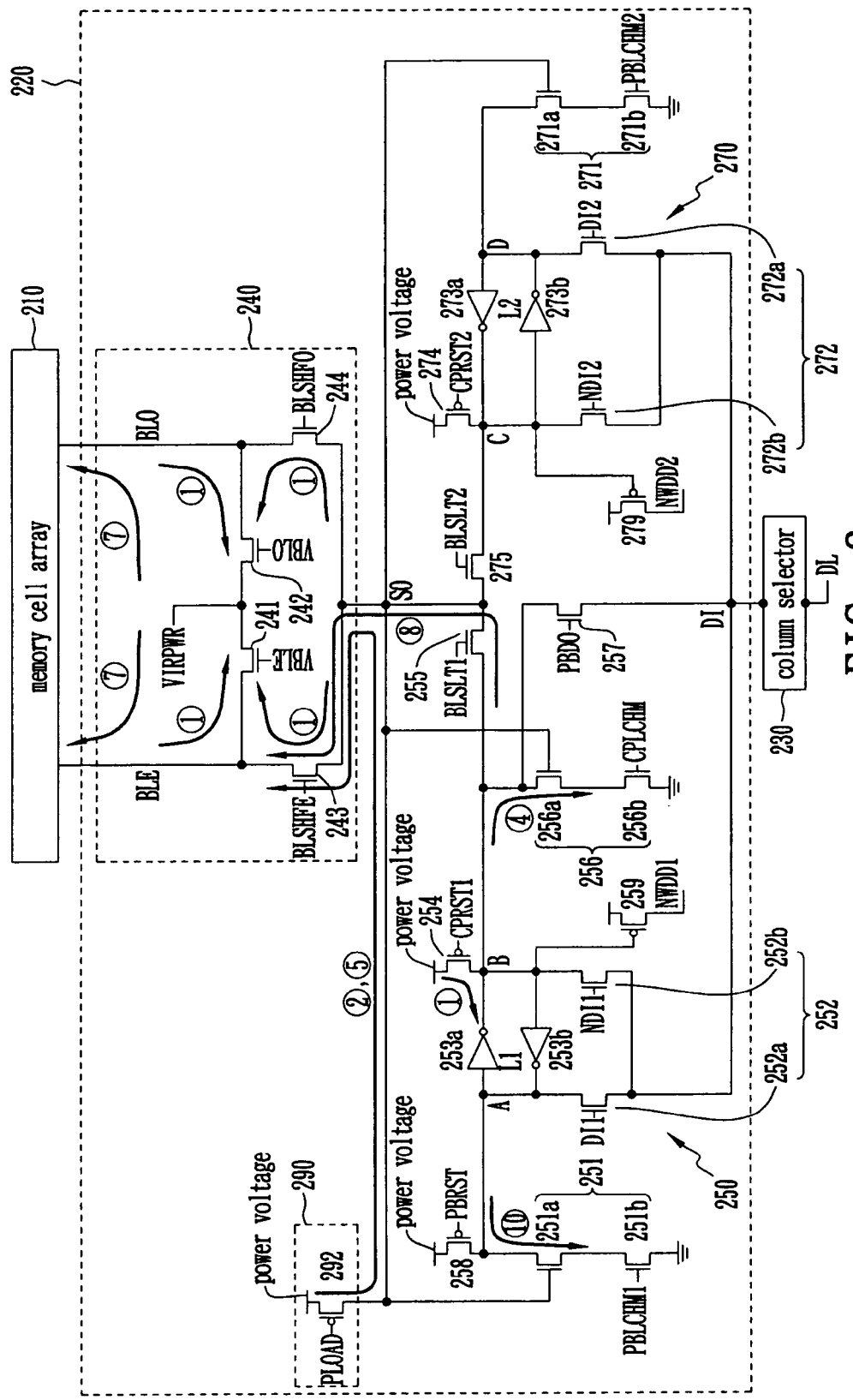
FIG. 8 illustrates a schematic view of data flows for a copy-back operation according to the first embodiment of the present invention.

Referring to FIG. 7 and FIG. 8, a copy-back operation of the device of FIG. 3 is described, where data is read out from a cell of memory cell array 210 into the first register 250, and copied back into another cell.

FIG. 7 shows command signals that are applied to the circuit of FIG. 2(*c*). The abscissa is divided into 11 segments, respectively labeled 1-11. Time segments 1, 2, 3 and 4 are the read periods. Time segments 5, 6, 7, 8, 9, 10 and 11 are the program periods.

At first (time segment 1), the control signals are the same as that shown in FIG. 5 (i.e., read operation) except that PMOS transistor 254 is turned on by activating the control signal CPRST1 logic low for a short period so that the latch node B of the first register 250 goes to a logic high state, and the signal PBRST remains at a logic high state.

In time segments 2 and 3, all control signals are the same as that aforementioned in the read operation.

In time segment 4, the control signals are the same as that aforementioned in the read operation except that a gate control signal CPLCHM of the NMOS transistor 256*b* goes to logic high for a short period and the signal PBLCHM1 signal remains at a logic low state. The NMOS transistor 256*a* is turned on or off according to the logic state of the sense node SO. Accordingly, the transistor 256*a* is turned on if the selected memory cells are in a programmed state, and is turned off if the selected memory cells are in an erased state. As a result, the state of the sense node SO is stored in the latch L1. In other words, the data state of the selected memory cells is stored in the first register 250. The second read control circuit 256 consisting of the transistors 256*a* and 256*b* is used for the so-called inverse read operation.

In time segments 5, 6, 7, 8, 9, 10 and 11, all control signals are the same as that in the time segments 3, 4, 5, 6, 7, 8 and 9 of FIG. 3 illustrating program operation. The data read in the time segments 1-4 is programmed into another cell in the memory cell array 210.

Regarding the second register 270, the functions of the third read control circuit 271, the third program control circuit 272, the fourth program control circuit 275, and the third pre-set control circuit 274 are similar to those of the corresponding devices of the first register 250. However, the normal read and copy-back functions are only performed by the first register 250, so that the third read control circuit 271 is only active during program verification, and the third pre-set control circuit 274 is only active during programming.

In addition, there are two PMOS transistors, 259 and PMOS 279. Gates of the transistors 259 and 279 are connected to the second latch node B and the third latch node C, respectively. Signals NWDD1 and NWDD2 are used to indicate the verification result for the first register 250 and second register 270.

The second read control circuit 256 is also used for erase verification operation. After erasing operation, the sense node SO should be at a logic low state, and the transistor 256b is turned off. But if an erase process is fail, the sense node SO should be at a logic high state, and the transistor 256b is turned on. While a pulse of CPLCHM is at a logic high state, then the second latch node B is pulled to a logic low state, and the transistor 259 is turned on. Thus the signal NWDD1 will be pull to a logic high state.

The first read control circuit 251 is also used for a program verification and copy-back program verification of the first register 250. After a program or copy-back program operation, the sense node SO should be at a logic high state and the transistor 251a is turned on. While a pulse of PBLCHM1 is at a logic high state, then the first latch node A is pulled to a logic low state, the second latch node B is pulled to a logic high state, so the transistor 259 is turned off. Thus the signal NWDD 1 will not be pulled to a logic high state. So if the signal NWDD1 is pulled to a logic high state, a program or copy-back program process is fail. Similarly, if the signal NWDD2 is pulled to a logic high state, a program process of the second register 270 is fail.

Figure 9A:
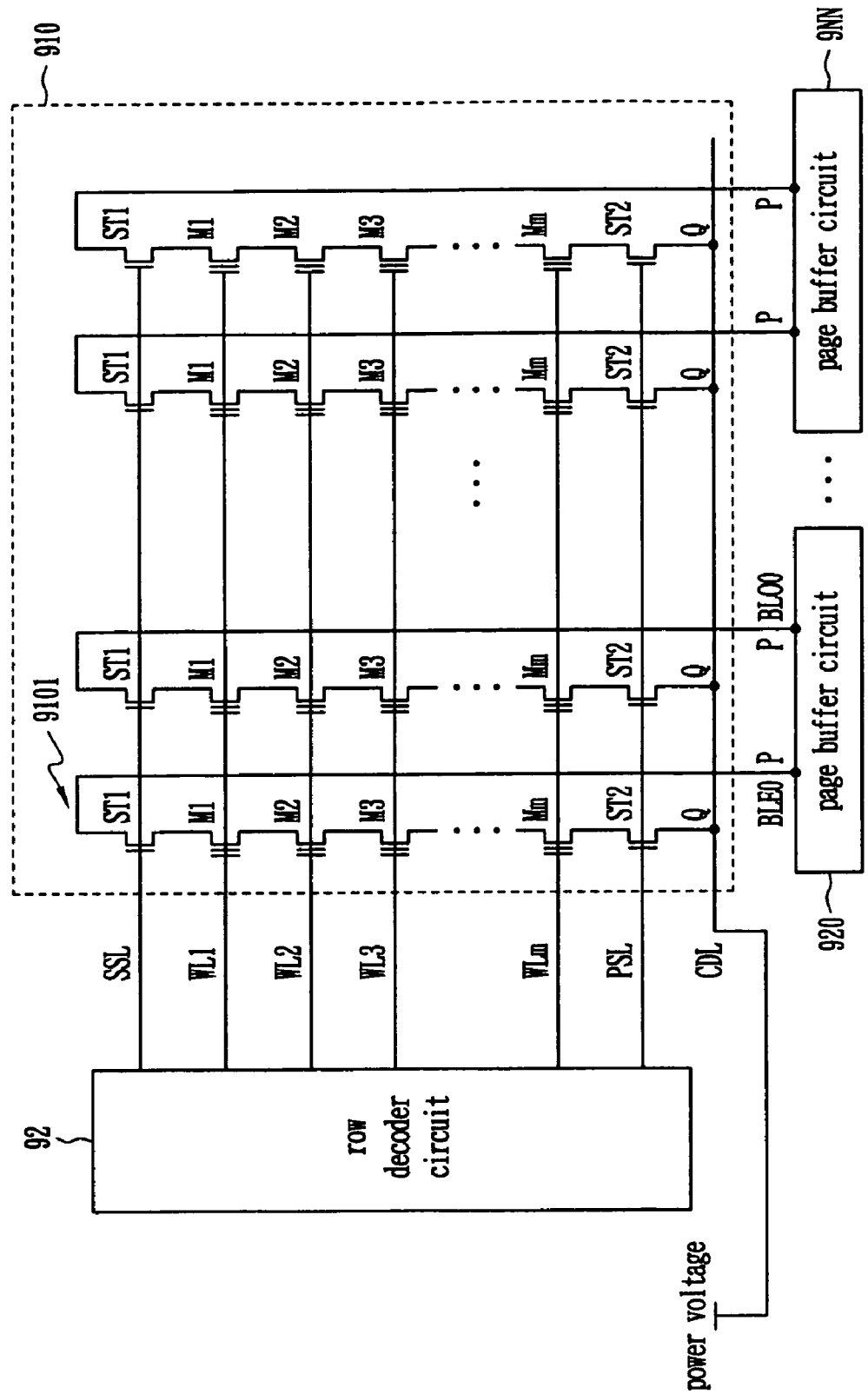
FIG. 9($a$) illustrates a schematic view of a diagram of a memory cell array according to the second embodiment of the present invention.

FIGS. 9(a), 9(b) and 10-15 illustrate the page buffer circuit and the methods thereof of the second embodiment of the present invention, where a cell of NAND flash memory operates in a reverse direction. Referring to FIG. 9(a), a memory cell array 910 has a plurality of cell strings 9101. Each cell string 9101 comprises a first end P electrically connected to a corresponding page buffer circuit 920 through a bit line BLE or BLO, and a second end Q electrically connected to a common drain line (CDL). A cell string 9101 includes a string selection transistor ST1 coupled to a bit line BLE, a power voltage selection transistor ST2 coupled to a common drain line CDL, and memory cells M1-Mm serially coupled to the string selection transistor ST1 and the power voltage selection transistor ST2. The bit line BLE is connected to the source node of the memory cell M1 through the transistor ST1, the common drain line CDL is connected to the drain node of the memory cell Mm through the transistor ST2. The string selection transistor ST1, the memory cells M1-Mm and the power voltage selection transistor ST2 are coupled to a string selecting line SSL, word lines WL1-WLm and a power voltage selecting line PSL, respectively. The lines SSL, WL1-WLm and PSL are electrically connected to a row decoder circuit 92. The common drain line CDL is connected to a power voltage.

Figure 9B:
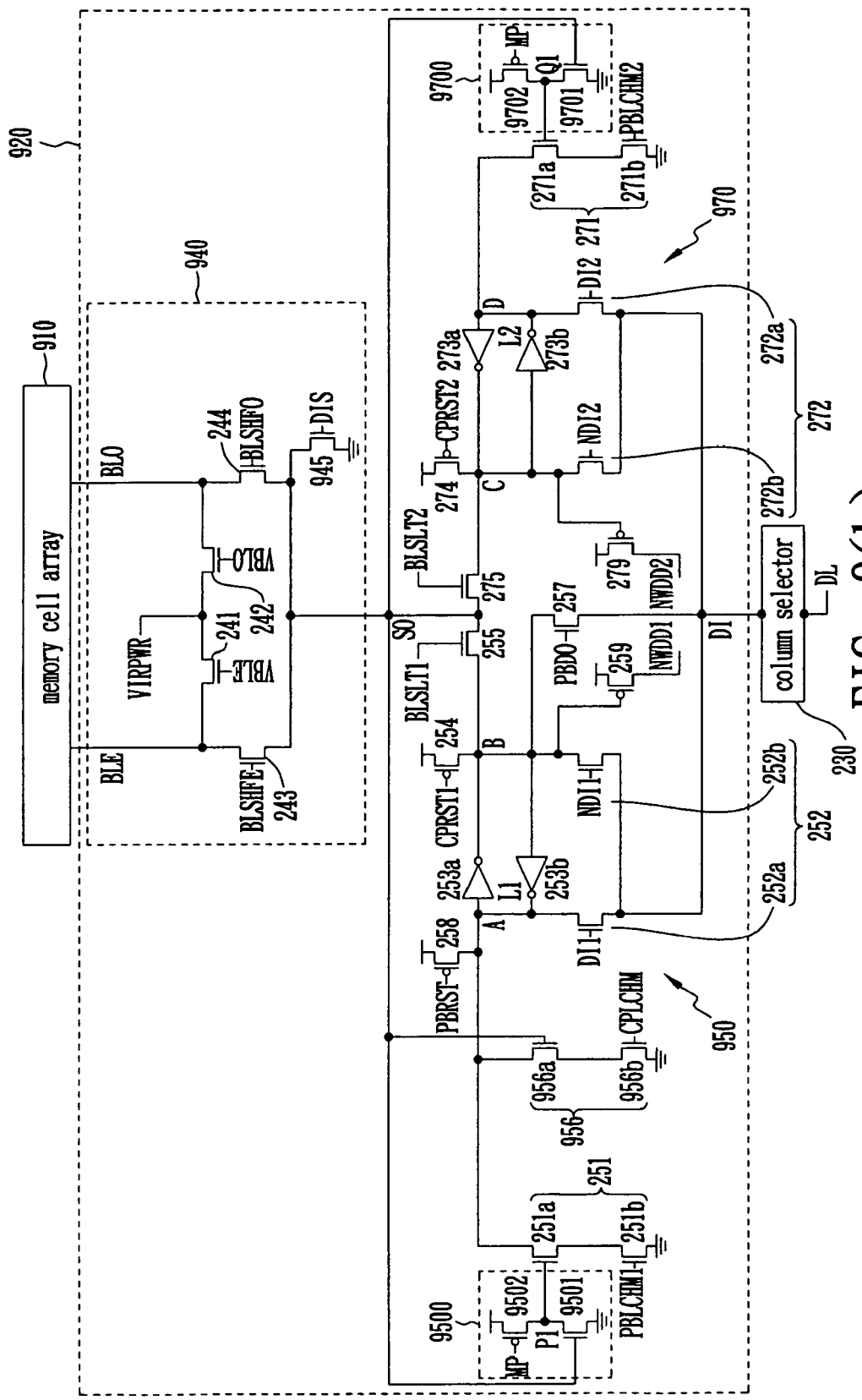

FIG. 9(b) illustrates a page buffer circuit 920 according to the second embodiment of the present invention. Compared to the circuit in FIG. 2(c), an NMOS transistor 945 controlled by a signal DIS is added to a bit line control circuit 940, a second read control circuit 956 consisting of NMOS transistors 956a and 956b is placed closed to the latch node A rather than the latch node B, an inverter 9500 is added between the sense node SO and the first read control circuit 251 of a first register 950, an inverter 9700 is added between the sense node SO and the third read control circuit 271 of a second register 970. An NMOS transistor 9501 and a PMOS transistor 9502 are serially coupled to form the inverter 9500. The transistor 251a is controlled by an output node P1 of the inverter 9500. Because a control signal MP of the transistor 9502 is at a logic low state, the node P1 is at an inverse logic state of the sense node SO. Similarly, NMOS transistor 9701 and PMOS transistor 9702 are serially coupled to form the inverter 9700. The transistor 271a is controlled by an output node Q1 of the inverter 9700. The control signal MP of the transistor 9702 is at a logic low state, so the node Q1 is at an inverse logic state of the sense node SO.

Figure 10:
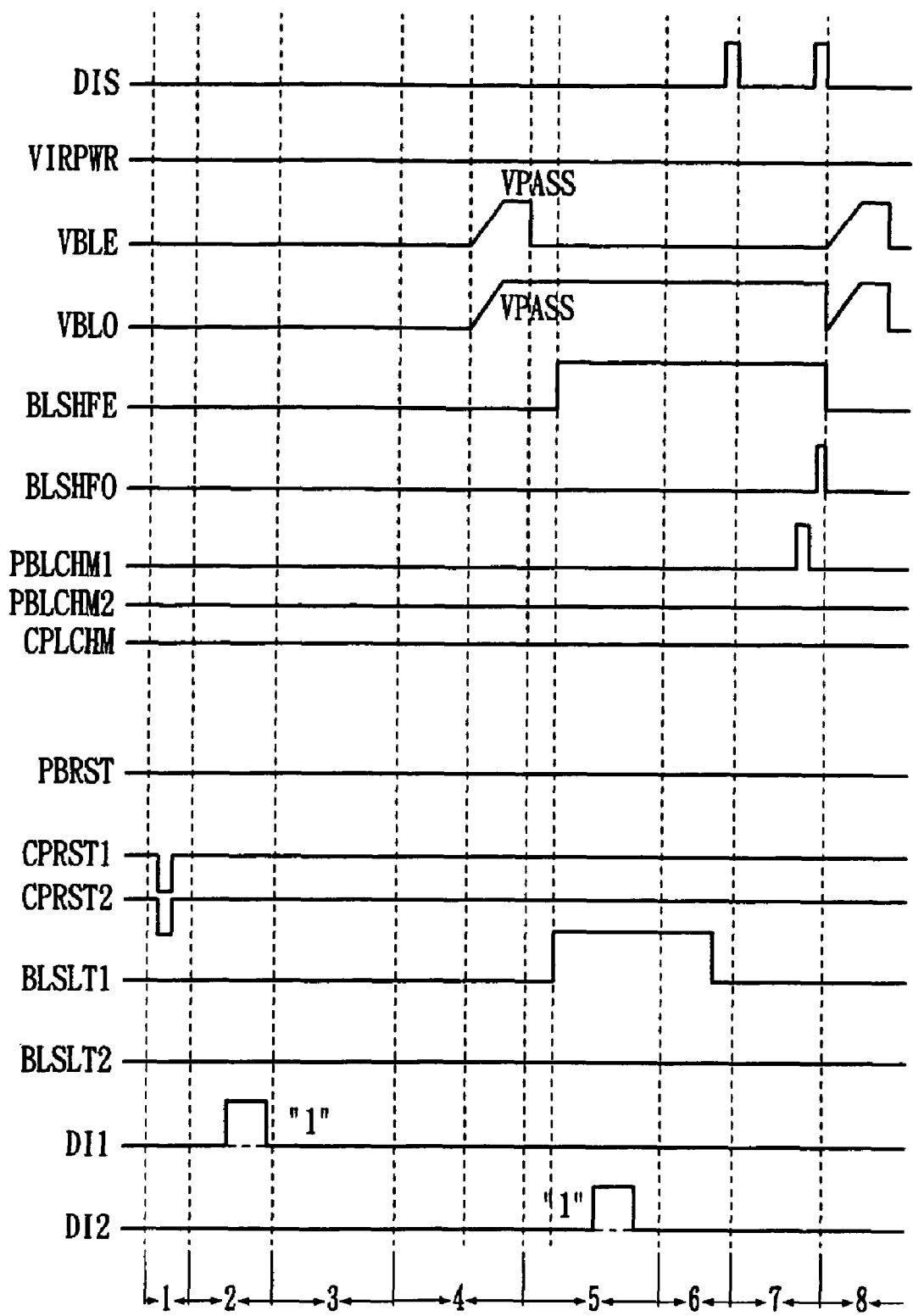
FIG. 10 illustrates a timing diagram for programming according to the second embodiment of the present invention.
Figure 11:
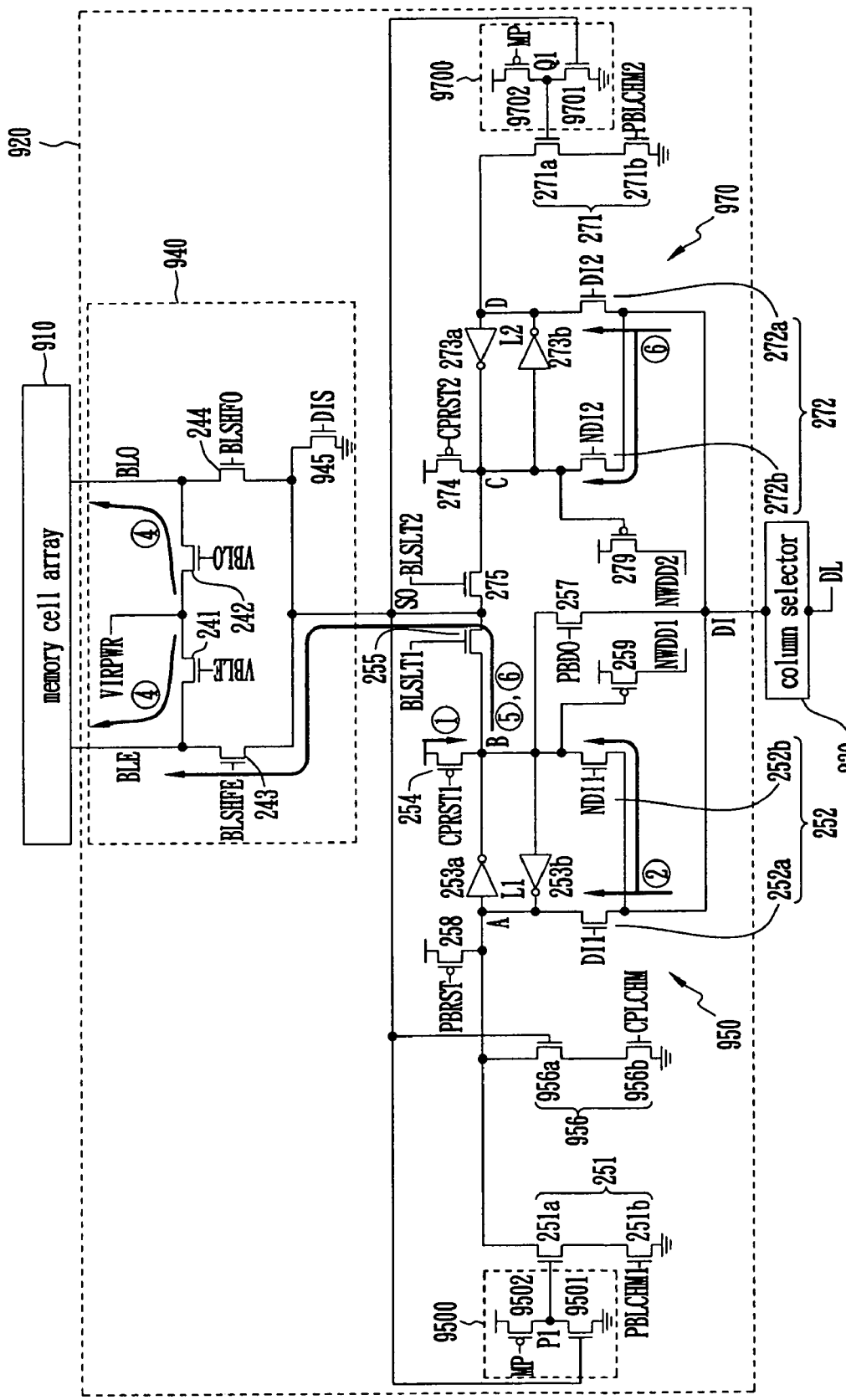
FIG. 11 illustrates a schematic view of data flows for programming according to the second embodiment of the present invention.

Referring to FIG. 10 and FIG. 11, a cache program method of the second embodiment is described. FIG. 10 shows command signals that are applied to the circuit of FIG. 9(b). The abscissa is divided into 9 segments, respectively labeled 1-9. FIG. 11 shows how data is transferred in the circuit of FIG. 9(b), which should be referred to along with FIG. 10 in the light of the labels.

In time segment 1, in order to pre-set the first register 950 and the second register 970 to a predetermined value, the PMOS transistors 254 and 274 are turned on by activating the control signals CPRST1 and CPRST2 logic low for a short period, respectively. Therefore, the latch nodes B and C of the registers 950 and 970 are at a logic high state.

In time segment 2, the transistors 252a and 252b are turned on by activating the control signal DI1 or NDI1 logic high, respectively, and consequently data "1" or "0" in a data line DL is stored in the first latch L1.

In time segment 4, the transistors 241 and 242 are turned on by activating the control signals VBLE and VBLO logic high, so as to pre-charge the bit lines BLE and BLO.

In time segment 5 and 6, two actions occur concurrently. The data to be programmed is transferred from the first register 950 to the selected bit line BLE by activating signals BLSLT1 and BLSHFE logic high, i.e., the transistor 255 is turned on, and then the data is transferred from the selected bit line BLE to the memory cell array 910. At the same time, the transistors 272a or 272b is turned on by activating the control signal DI1 or NDI2 logic high, respectively, e.g., DI1 is logic high in this embodiment. Consequently, data "1" or "0" in the data line DL is stored in the second latch L2, i.e., the next data to be programmed is stored in the second register 970 from the data line DL. Once the signal BLSLT1 returns to logic low in the time segment 6, the verification for programming starts. The NMOS transistor 945 is turned on by activating the control signal DIS logic high for discharging the bit line BLE.

In time segment 7, the read operation continues. A pulse of PBLCHM1 is used to latch the bit line signal. Then (time segment 8), the bit lines BLE and BLO are pre-charged again for the next cache program operation.

Figure 12:
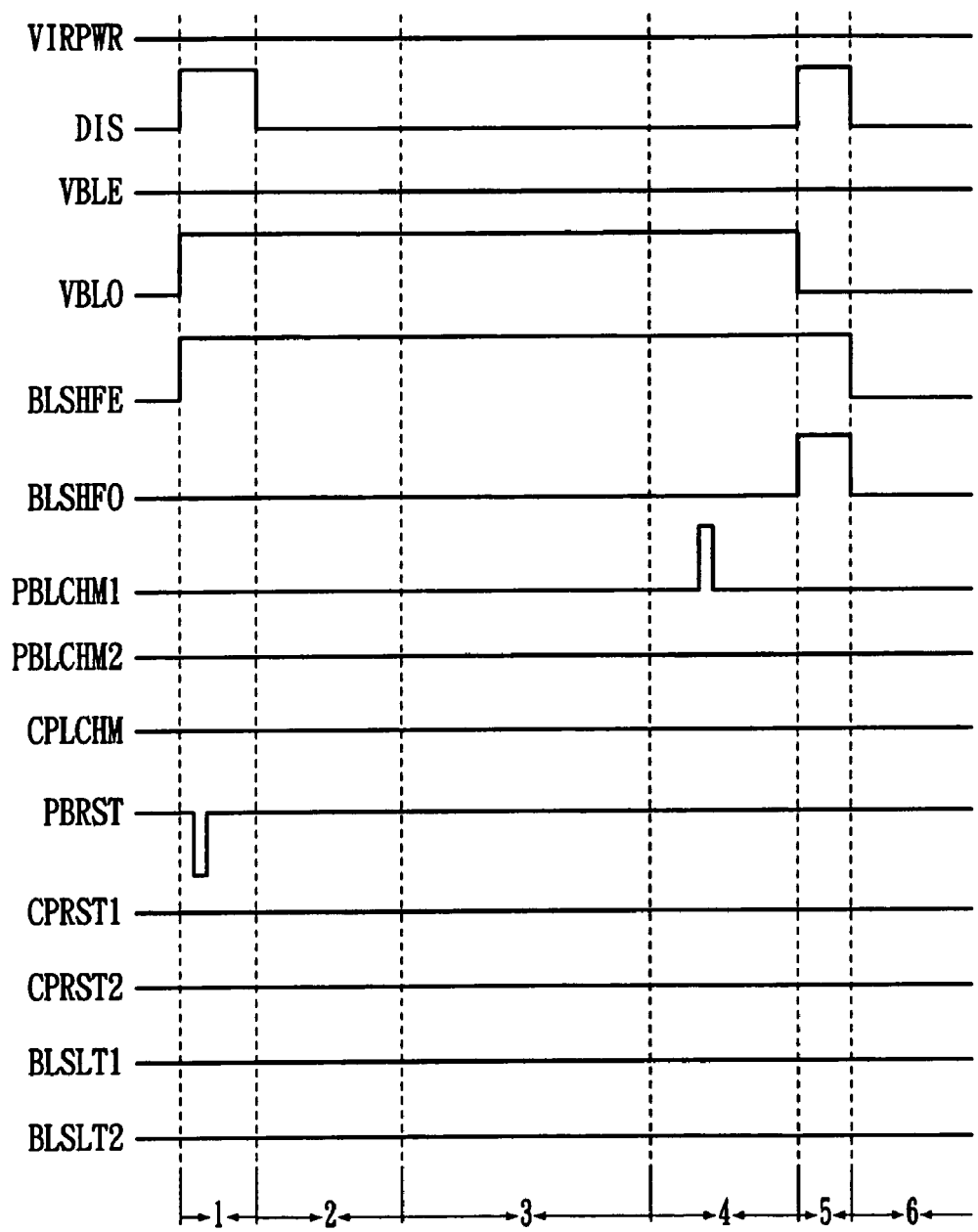
FIG. 12 illustrates a timing diagram for reading according to the second embodiment of the present invention.
Figure 13:
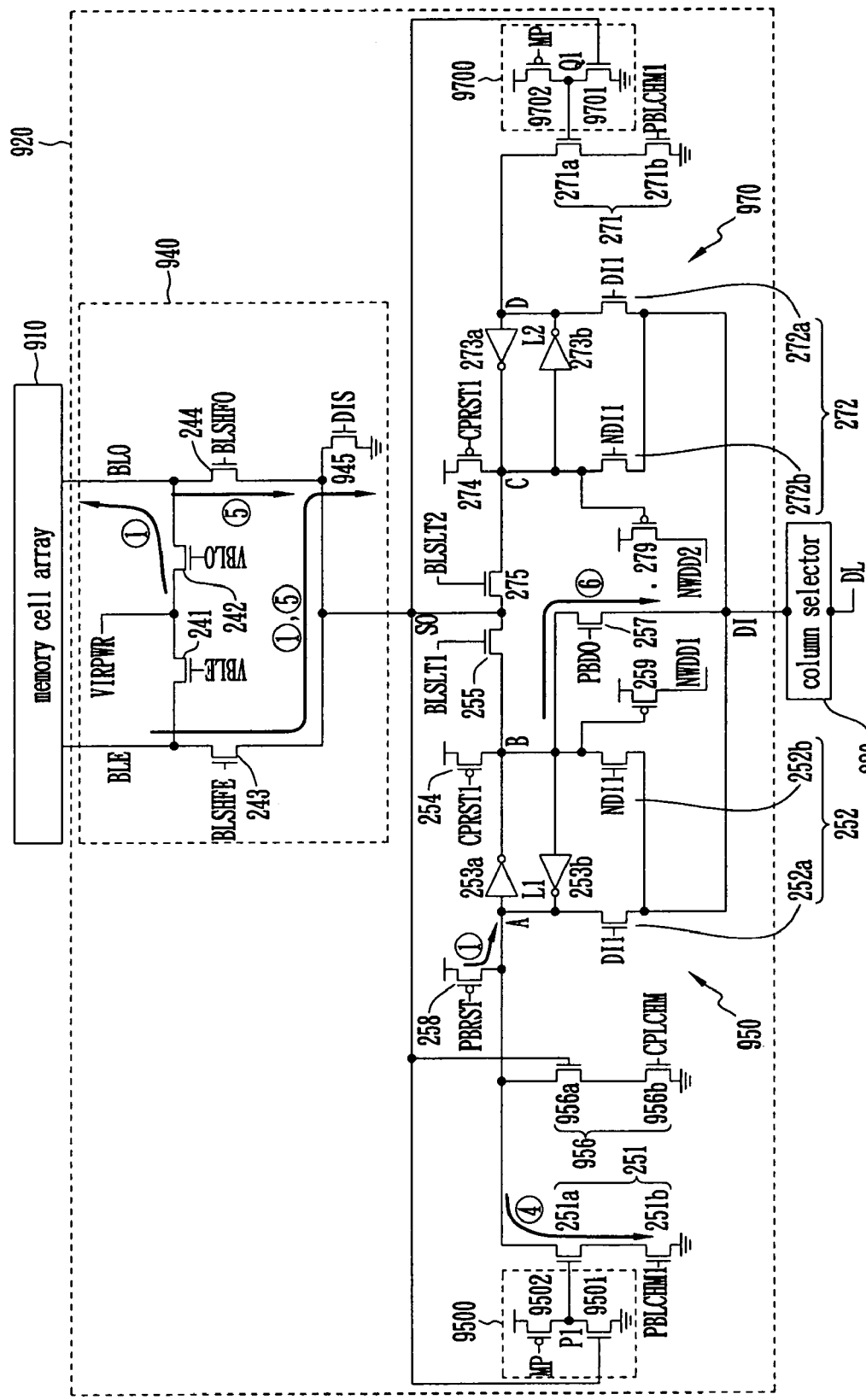
FIG. 13 illustrates a schematic view of data flows for reading according to the second embodiment of the present invention.

Referring to FIG. 12 and FIG. 13, a normal read operation of the page buffer circuit 920 is exemplified.

At first (time segment 1), the bit line BLE is first discharged through the NMOS transistors 243 and 945 by activating the control signals BLSHFE and DIS logic high. The transistor 242 is turned on by activating the control signal VBLO logic high so that the bit line BLO is pulled to logic high when the signal VIRPWR is at a logic high state, with a view to preventing non-selected cells from incorrect operation. At the same time, a PBRST signal switches from a logic high state to a logic low state for a short period to turn on the transistor 258, and consequently the latch node A of the first register 950 is set to a logic high state.

Compared to the read operation of the first embodiment, the bit line pre-charge operation in the second embodiment does not exist, so there are no transitions on all the signals in time segment 2 and time segment 3.

In the case where the selected memory cell is in a programmed state, the voltage of the bit line continues to be logic low. In the case where the selected memory cell is in an erased state, the voltage of the bit line is pulled to logic high. In other words, the sense node SO has an inverse state to that of the memory cell. Therefore, the inverter 9500 is employed to invert the state of SO in an attempt to indicate the correct state of the accessed cell.

In time segment 4, a pulse of PBLCHM1 is used to latch the bit line signal to the latch L1 of the first register 950.

In time segment 5, the bit lines BLE and BLO and the sense node SO are discharged through the NMOS transistor 945 by activating the control signals DIS, BLSHFE, and BLSHFO logic high.

In time segment 6, the data stored in the first register 950 is transferred to the data line DL through the NMOS transistor 257, which is controlled by a control signal PBDO.

Figure 14:
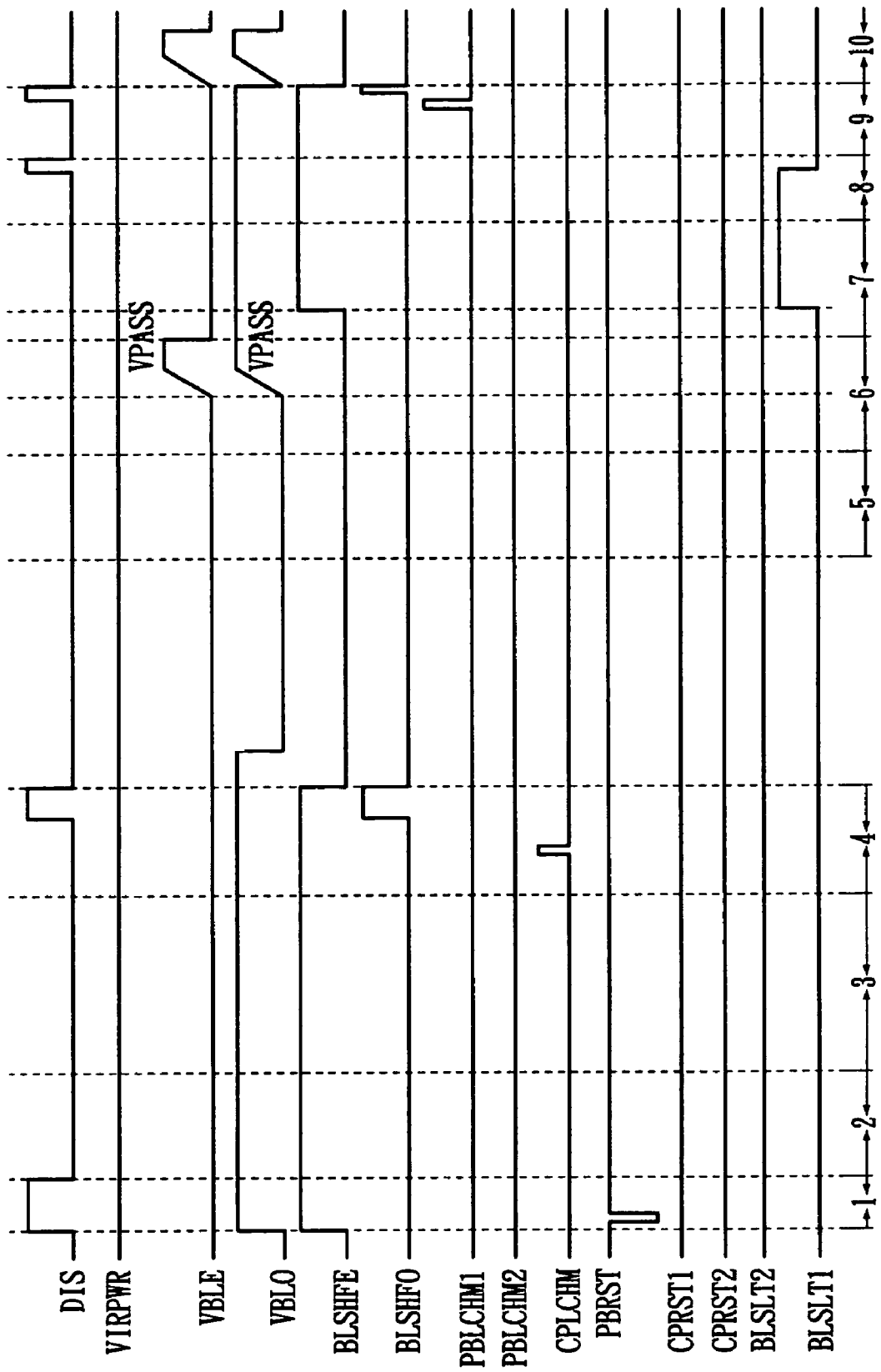
FIG. 14 illustrates a timing diagram for a copy-back operation according to the second embodiment of the present invention.
Figure 15:
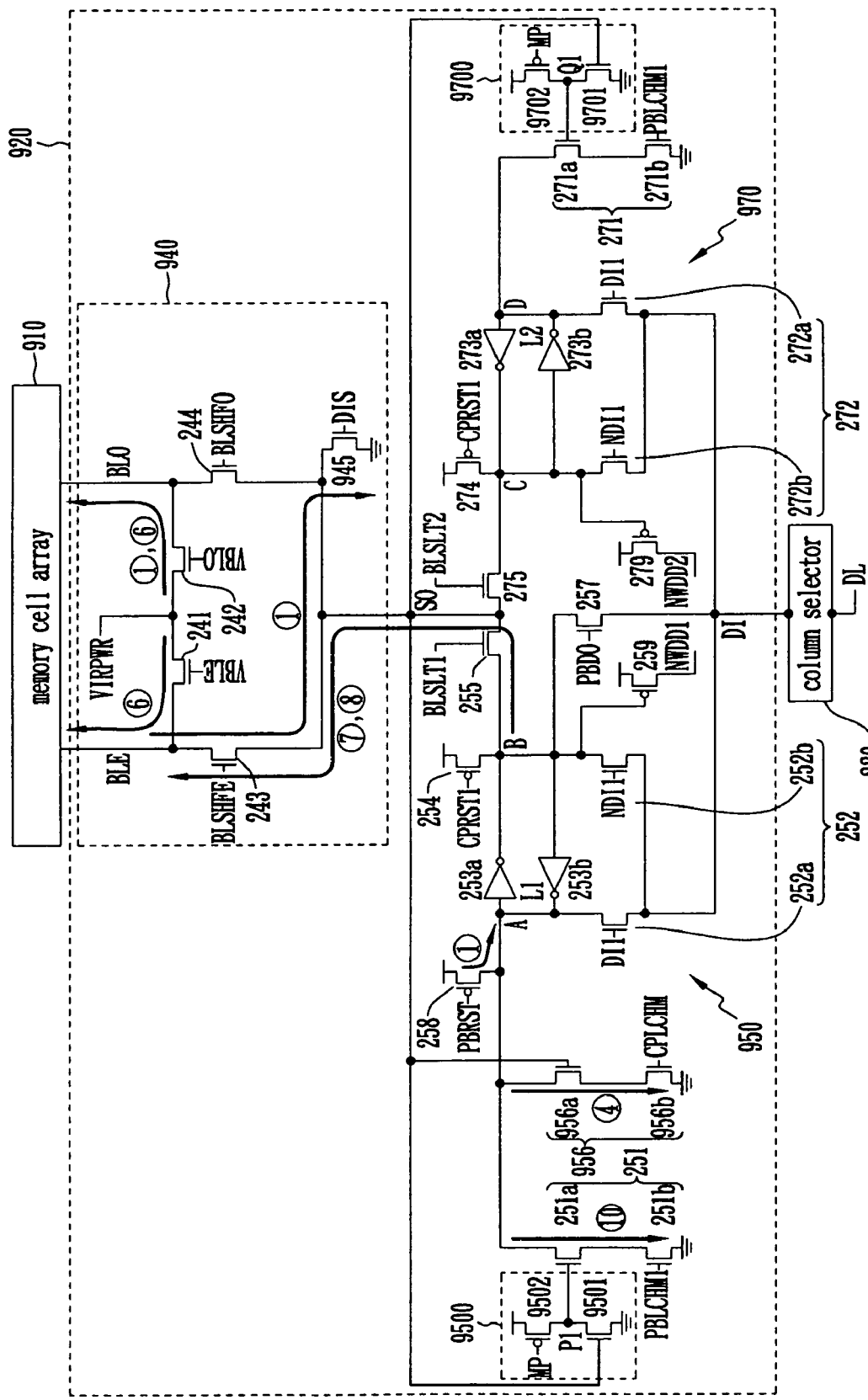
FIG. 15 illustrates a schematic view of data flows for a copy-back operation according to the second embodiment of the present invention.

Referring to FIG. 14 and FIG. 15, a copy-back operation of the device of FIG. 9(b) is exemplified. FIG. 14 shows command signals that are applied to the circuit of FIG. 9(b). The abscissa is divided into 11 segments, respectively labeled 1-11. The time segments 1, 2, 3 and 4 are read periods. The time segments 5, 6, 7, 8, 9 and 10 are program periods.

In time segments 1, 2 and 3, all control signals are the same as that shown in FIG. 12, i.e., read operation.

In time segment 4, the control signals are the same as the read operation except that a pulse of CPLCHM instead of PBLCHM1 is used to latch the bit line signal to the latch L1 of the first register 950. Because no reverse read during reading in the copy-back operation, the second read control circuit 956 including transistors 956a and 956b are placed on the other side of the latch L1 in comparison with the circuit 256a and 256b in FIG. 2(c).

In time segments 5, 6, 7, 8, 9 and 10, all control signals are the same as those of the time segments 3, 4, 5, 6, 7 and 8 shown in FIG. 10, i.e., program operation.

As mentioned in the first embodiment, the second read control circuit 956 is also used for erase verification operation. After erase verification operation, if the signal NWDD1 is pulled to a logic high state, the erase verification process is fail.

The first read control circuit 251 is also used for a program verification and copy-back program verification of the first register 950. After a program or copy-back program operation, if the signal NWDD1 is pulled to a logic high state, a program or copy-back program process is fail. Similarly, if the signal NWDD2 is pulled to a logic high state, a program process of the second register 970 is fail.

As mentioned above, the first and second registers of the page buffer circuit alternately perform programming and store data to be programmed from the data line. The data transfer between two registers of the page buffer can be omitted, and therefore the device can work more efficiently. Moreover, a pre-charge process is not needed during a read operation for the memory cell array operated in a reverse direction, so memory access time and power consumption can be reduced.

The above-described embodiments of the present invention are intended to be illustrative only. Numerous alternative embodiments may be devised by those skilled in the art without departing from the scope of the following claims.

We claim:

1. A non-volatile memory device, comprising:
a memory cell array;
a selector circuit coupled to a data line; and
a page buffer circuit comprising a first register and a second register and being coupled between the memory cell array and the selector circuit, wherein the first and second registers are commonly coupled through a sense node, wherein said first register comprises a first read control circuit for latching data of the memory cell array during a read or program verification or copy-back program verification operation and a second read control circuit for latching data of the memory cell array during a copy-back read or erase verification operation, wherein the first and second registers alternately program data to the memory cell array, and wherein, as one of the first and second registers performs programming, the other register stores data from the data line concurrently.

2. The non-volatile memory device of claim 1, wherein only the first register is activated during a read operation.

3. The non-volatile memory device of claim 1, wherein only the first register is activated during a copy-back operation.

4. The non-volatile memory device of claim 1, wherein the page buffer circuit further comprises a bit line control circuit having two bit lines coupled between the memory cell array and the sense node.

5. The non-volatile memory device of claim 4, wherein the memory cell array comprises a cell string having a first end electrically connected to the page buffer circuit through the bit line, and a second end electrically connected to a common source line with a ground voltage.

6. The non-volatile memory device of claim 4, wherein the page buffer circuit further comprises a pre-charge circuit coupled between the sense node and the first register for pre-charging the bit lines.

7. The non-volatile memory device of claim 1, wherein the first register further comprises:
a first latch for latching data, the first latch having a first latch node and a second latch node;
a first program control circuit coupled between the first and second latch nodes and a data node coupled to the selector circuit for transferring data on the data line to the first latch during a program operation;
a second program control circuit coupled between the second latch node and the sense node for transferring data in the first latch to the sense node;
a first pre-set control circuit coupled to the second latch node for setting the first latch to a predetermined value during programming or a copy-back operation; and
a second pre-set control circuit coupled to the first latch node for setting the first latch to a predetermined value during a read operation.

8. The non-volatile memory device of claim 7, wherein the first read control circuit is coupled between the first latch node and ground.

9. The non-volatile memory device of claim 7, wherein the second read control circuit is coupled between one of the first and second latch nodes and ground.

10. The non-volatile memory device of claim 7, wherein the first register further comprises:
a fourth read control circuit coupled between the second latch node and the data node for transferring data in the first latch to the data line during a read operation.

11. The non-volatile memory device of claim 1, wherein the first read control circuit comprises two NMOS transistors serially coupled; wherein one NMOS transistor has a gate coupled to the sense node; and wherein the other NMOS transistor has a gate coupled to a control signal.

12. The non-volatile memory device of claim 7, wherein the second program control circuit is comprised of a transistor.

13. The non-volatile memory device of claim 7, wherein the first pre-set control circuit is comprised of a transistor.

14. The non-volatile memory device of claim 7, wherein the first program control circuit comprises two NMOS transistors; wherein one NMOS transistor is coupled between the first latch node and the data node; wherein the other NMOS transistor is coupled between the second latch node and the data node; and wherein only one of the two NMOS transistors turns on at one time.

15. The non-volatile memory device of claim 1, wherein the first and second registers are coupled to the sense node and a data node in parallel.

16. The non-volatile memory device of claim 1, wherein the second read control circuit comprises two serially coupled NMOS transistors; wherein one NMOS transistor has a gate coupled to the sense node; and wherein the other NMOS transistor has a gate coupled to a control signal.

17. The non-volatile memory device of claim 10, wherein the fourth read control circuit is comprised of a transistor.

18. The non-volatile memory device of claim 7, wherein the second pre-set control circuit is comprised of a transistor.

19. The non-volatile memory device of claim 1, wherein the second register further comprises:
   a second latch for latching data, the second latch having a third latch node and a fourth latch node;
   a third read control circuit coupled between the fourth latch node and ground for latching bit line data to the second latch during a program verification operation;
   a third program control circuit coupled between the third and fourth latch nodes and the data node for transferring data on the data line to the second latch during a program operation;
   a fourth program control circuit coupled between the third latch node and the sense node for transferring data in the second latch to the sense node; and
   a third pre-set control circuit coupled to the third latch node for setting the second latch to a predetermined value during a program operation.

20. The non-volatile memory device of claim 1, further comprising an inverter circuit coupled between the first register and the sense node for inverting the logic state of the sense node.

21. The non-volatile memory device of claim 20, wherein the memory cell array comprises a cell string having a first end electrically connected to the page buffer circuit through the bit line, and a second end electrically connected to a common drain line with a voltage level.

22. The non-volatile memory device of claim 1, further comprising an inverter circuit coupled between the first read control circuit and the sense node for inverting the logic state of the sense node.

23. The non-volatile memory device of claim 22, wherein the first read control circuit comprises two NMOS transistors serially coupled; wherein one NMOS transistor has a gate coupled to the sense node through the inverter circuit; and wherein the other NMOS transistor has a gate coupled to a control signal.

24. The non-volatile memory device of claim 20, wherein the inverter circuit comprises a PMOS transistor and an NMOS transistor serially coupled, and wherein the NMOS transistor has a gate coupled to the sense node.

* * * * *